United States Patent
Krueger et al.

(10) Patent No.: US 6,949,399 B2
(45) Date of Patent: Sep. 27, 2005

(54) METHOD OF REDUCING CONTAMINATION-INDUCED PROCESS VARIATIONS DURING ION IMPLANTATION

(75) Inventors: Christian Krueger, Liegau-Augustusbad (DE); Niels-Wieland Hauptmann, Boxdorf (DE); Thomas Beck, Ottendorf-Okrilla (DE)

(73) Assignee: Advanced Micro Devices, Inc., Austin, TX (US)

( * ) Notice: Subject to any disclaimer, the term of this patent is extended or adjusted under 35 U.S.C. 154(b) by 108 days.

(21) Appl. No.: 10/602,191

(22) Filed: Jun. 24, 2003

(65) Prior Publication Data

US 2004/0161915 A1 Aug. 19, 2004

(30) Foreign Application Priority Data

Jan. 30, 2003 (DE) ........................................ 103 03 683

(51) Int. Cl.$^7$ ............................................... H01L 21/00
(52) U.S. Cl. ......................................... 438/61; 438/528
(58) Field of Search ........................... 438/61, 515, 516, 438/528

(56) References Cited

U.S. PATENT DOCUMENTS

| | | | | |
|---|---|---|---|---|
| 4,714,834 A | * | 12/1987 | Shubaly | 250/427 |
| 5,136,171 A | * | 8/1992 | Leung et al. | 250/492.2 |
| 6,284,630 B1 | * | 9/2001 | Yu | 438/511 |
| 6,452,338 B1 | * | 9/2002 | Horsky | 315/111.81 |
| 6,521,502 B1 | * | 2/2003 | Yu | 438/305 |
| 6,710,358 B1 | * | 3/2004 | Chen et al. | 250/492.21 |
| 2002/0164845 A1 | * | 11/2002 | Hamamoto | 438/190 |

* cited by examiner

*Primary Examiner*—W. David Coleman
(74) *Attorney, Agent, or Firm*—Williams, Morgan & Amerson, P.C.

(57) ABSTRACT

When changing a dopant species in an implantation tool, typically a clean process is performed to reduce cross-contamination, which is considered a major issue in implant cycles applied in advanced CMOS processes. Especially, the employment of an implanter previously used for heavy ions may generate increased cross-contamination when subsequently used for boron or phosphorus implants at moderate energies. A clean implant process using xenon gas may effectively reduce this cross-contamination at shorter process times compared to a conventional argon clean step.

27 Claims, 1 Drawing Sheet

METHOD OF REDUCING CONTAMINATION-INDUCED PROCESS VARIATIONS DURING ION IMPLANTATION

BACKGROUND OF THE INVENTION

1. Field of the Invention

The present invention generally relates to the fabrication of microstructures, such as integrated circuits, and, more particularly, to the incorporation of material species, such as dopants, into a substrate by ion implantation.

2. Description of the Related Art

In many technical fields, implantation of ions into a substrate is a widely used technique to alter the characteristics of the substrate or of a specified portion thereof by incorporating a specified species. For example, the rapid development in the semiconductor industry is among others based on the capability of advanced implantation techniques to generate highly complex dopant profiles within tiny regions of semiconductive and dielectric materials. In implanting specified ions into a substrate, not only a lateral implant profile may be readily obtained by providing correspondingly adapted implantation masks, for example formed as resist masks by photolithography, but also allows a vertical profile. To this end, an acceleration energy of the ions to be implanted is adjusted so as to deposit the majority of the ions at a specified depth of the substrate. Thus, contrary to doping a substrate by diffusion, lateral and in depth varying profiles may be created, thereby enabling the formation of complex dopant profiles as required, for instance, in well and drain and source structures of advanced transistor elements. Moreover, by appropriately selecting the dose, i.e., the number of ions per unit area of the ion beam impinging on a substrate, comparably high concentrations of atoms with short time intervals may be incorporated into a substrate compared to other techniques, such as diffusion, and therefore renders ion implantation a cost-effective technique.

Although ion implantation offers a plurality of advantages over other techniques, there are several drawbacks involved in employing ion implantation. For instance, the highly energetic ions generate severe damage in crystalline structures that commonly has to be cured by annealing the substrate, thereby changing the dopant profile as deposited owing to the unavoidable diffusion process during the anneal process. Similarly, the highly energetic ions may not be completely confined so as to exclusively hit the target, but may also interact with surface portions of the implantation tool, such as process chamber walls, inner surfaces of beam line, support means for fixing the substrate, and the like. During this interaction, metal atoms may be liberated and may become ionized and conveyed to the substrate where the metal atoms may be incorporated into the substrate.

A further source of contamination is the cross-contamination of the implantation tool and thus of a substrate processed therein. Cross-contamination may readily occur when an implantation tool is operated with a first dopant species, which may according to the implantation kinetics also interact with some surface portions of the tool that are exposed to the ions of the first species. Accordingly, ions of the first species may be incorporated into those exposed portions. Thereafter, the implantation tool may be used to implant a second, different species into the same or a different type of substrate, wherein then the atoms of the first species may be released by getting sputtered off the exposed surface portions. These atoms may be ionized and may then be deposited on and in the substrate along with the ions of the second species. In modem integrated circuits, however, even minute amounts of dopant variations may lead to significant variations of device characteristics due to the extremely complex dopant profiles required to adjust the properties of transistors having minimum feature sizes of 0.1 $\mu$m and even less.

Especially in sophisticated CMOS techniques, the well and the so-called halo implants require sufficiently steep dopant profiles to obtain the desired transistor performance. That is, usually heavy dopant species, such as arsenic, indium or antimony are used at high dosages in the range of approximately $10^{12}$ to $10^{14}$ ions/cm$^2$ so as to confine the dopants within the region of interest with a desired small tolerance as, typically, heavy ions tend to get less scattered and thus less spread during the implantation process. Moreover, subsequent anneal processes affect the profile less as deposited, as is the case for lighter atoms. However, the heavy ions provided at a high dose may lead to an increased cross-contamination, especially when the implantation tool is used for the implantation of light ions, such as boron and phosphorus, at low energy as is required for source and drain implants and the like. Exclusively employing a specified tool with a certain dopant species may, however, not be considered an attractive option owing to cost concerns.

Therefore, a need exists for an effective technique that reduces cross-contamination during ion implantation when changing the dopant species.

SUMMARY OF THE INVENTION

The present invention is generally directed to an improved clean sequence prior to or during the implantation of a species, wherein especially the cleansing effect with respect to heavy ions, such as indium and antimony, is improved. This is accomplished by operating an implantation tool with xenon, for example, after the implantation species on the implantation process has been changed.

According to one illustrative embodiment of the present invention, a method comprises operating an implantation tool with a first species including a first dopant and operating the implantation tool with xenon as an implant precursor to reduce residues of the first species from the implantation tool. Moreover, the implantation tool is then operated with a second species including a second dopant.

In a further illustrative embodiment of the present invention, a method of doping a substrate comprises operating an implantation tool with xenon as the implantation species prior to installing the substrate in the implantation tool to reduce contaminating particles. Then, the implantation tool is operated with the substrate mounted therein to implant a first species of dopants in the substrate.

According to still another illustrative embodiment of the present invention, a method of doping substrates comprises mounting a substrate in an implantation tool and operating the implantation tool with a first species of dopants to implant the first dopant into a crystalline region of the substrate. The implantation tool is then operated with xenon as the implantation species to substantially amorphize a portion of the crystalline region. Finally, the implantation tool is operated with a second species of dopants to implant the second dopants into the substantially amorphized portion.

BRIEF DESCRIPTION OF THE DRAWINGS

The invention may be understood by reference to the following description taken in conjunction with the accom- FIG. 1 schematically depicts in a very simplified manner an implantation tool which may be used in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Figure 1:
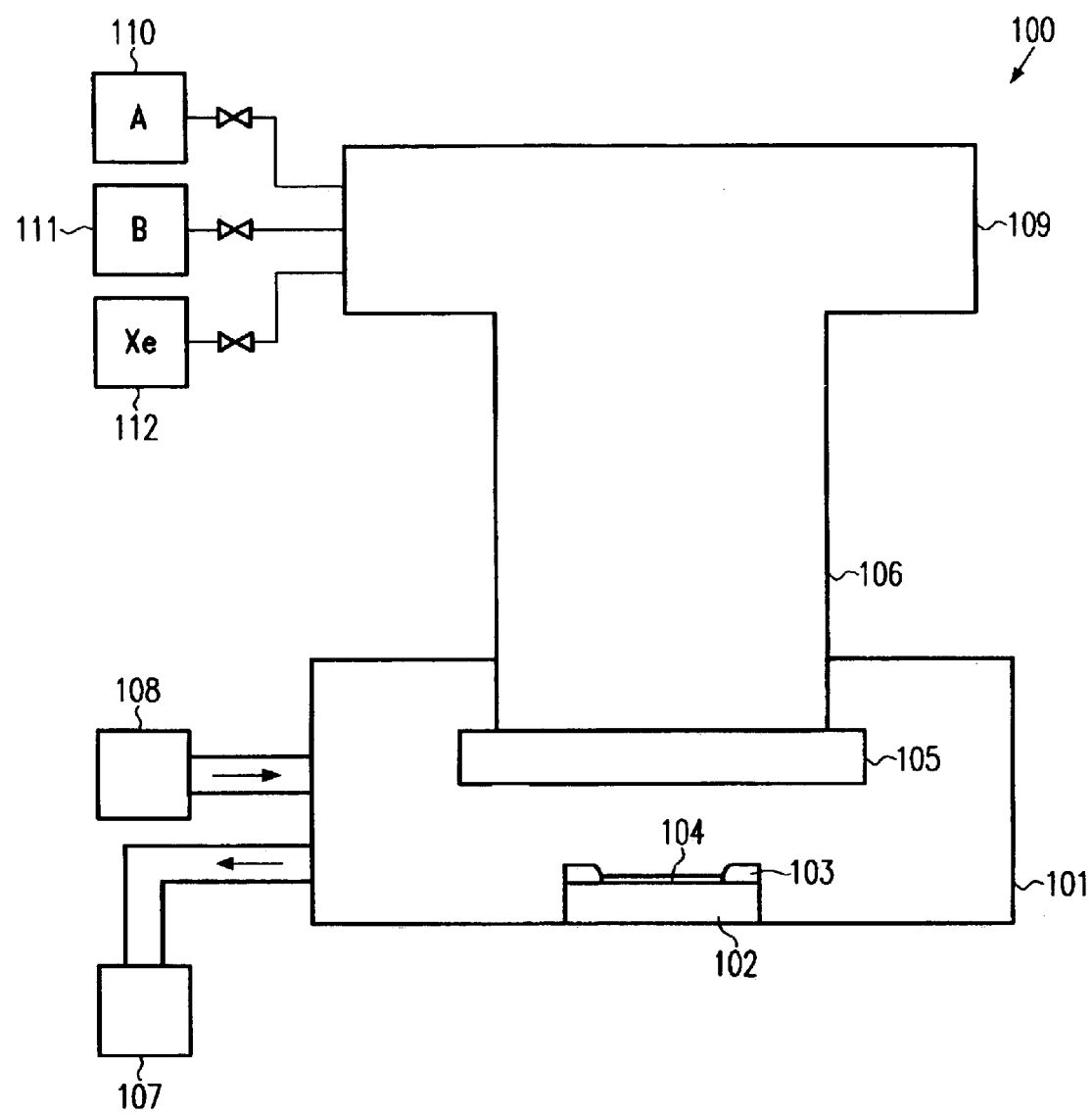

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously pointed out, cross-contamination is a potential risk when an implantation tool is to be used for different implantation species, as is commonly the case in the field of research and industrial production due to high cost and significant floor space required for plural implantation tools. Moreover, the plurality of dopants used in sophisticated devices does practically prevent manufacturers from using implantation tools dedicated to only one dopant species. Therefore, cleaning steps with argon as an implant species are frequently performed after one species is replaced by another species prior to actually implanting the new species. An argon clean step usually takes approximately 15–30 minutes, wherein it turns out, however, that argon exhibits a reduced cleaning effect for indium and antimony, entailing extremely long clean cycles that significantly increase process times.

According to the present invention, xenon may be used during the change of species, wherein a significantly improved clean effect may be achieved, even with reduced cleaning intervals, compared to argon clean cycles. Moreover, the cleaning process with xenon itself may advantageously be used for processing a substrate to amorphize crystalline portions by the inert xenon ions.

With reference to FIG. 1, further illustrative embodiments will now be described. In FIG. 1, an illustrative example of an implantation tool 100 comprises a process chamber 101 including a substrate holder 102 with a substrate 104 placed thereon and fixed with support members 103. The process chamber 101 may be connected to a vacuum pump 107 and a source of purge gas 108 to establish a desired atmosphere during the implantation process and to allow purging the process chamber 101 according to process requirements. A beam line 106 is connected to the process chamber 101 and separated therefrom by a shutter 105. At the other end, the beam line 106 is connected to ionization means 109, including means (not shown) for ionizing a precursor gas supplied thereto. Moreover, any means for creating and shaping an ion beam are not shown for the sake of clarity. Connected to the ionization means are a first source of dopant species 110 and a second source of dopant species 111. For example, the first source 110 may comprise a species for generating indium, arsenic or antimony dopants, as are often employed in forming well and halo implants in advanced field effect transistors of modern CMOS circuits. The second source may comprise a species for generating light dopants, such as boron and phosphorus, commonly used for source/drain regions, threshold implants, channel stop implants, anti-punchthrough implants, and the like.

Moreover, a xenon source 112 is connected to the ionization means 109, wherein, in one embodiment, the xenon source may be provided as a mobile bottle that may additionally be switchably connected to a further clean gas source (not shown), such as an argon source. This allows one to alternatively use argon and xenon while requiring only a single connection to the implantation tool 100 so that the present invention may readily be practiced with existing tools without elaborate modifications of the tool. In one embodiment, the xenon source 112 is used with implantation tool EHP500i, available from Varian, wherein the xenon source 112 may be connected to an argon line by a switchable valve (not shown) so that each of the slots for dopant precursors may still be used for commonly required species, such as the sources 110 and 111 and the argon for conventional processes and xenon may selectively be used.

In operation, for example, the first source 110, including, for example, a precursor for heavy dopants, such as indium, may be connected to the ionization means 109 to start implantation of a first species into the substrate 104. A dose may be selected in accordance with process specifications and may, for typical well and halo implants, be in the range of approximately $10^{12}$ to $10^{14}$ ions/cm$^2$. It should be appreciated that the above values are illustrative only and any other dosage may be used if appropriate. The implantation energy depends on the implantation depth and the species and may typically range for the above-mentioned well and halo implants from approximately 30–150 keV.

After processing one or more substrates, such as the substrate 104, it may be necessary to operate the implantation tool 100 with the species provided by source 111. To this end, in one embodiment, the xenon source 112 may be connected to the ionization means 109 after removal of the substrate 104, and the implantation tool may be operated with xenon at a dose of approximately $10^{14}$ to $10^{15}$ ions/cm$^2$. The acceleration energy may be adjusted to approximately 30–200 keV, and, in one embodiment, to approximately 40–160 keV. A duration of the cleaning interval may range from approximately 2–15 minutes or even longer if desired. During operation of the implantation tool 100 with xenon, residues of the preceding dopants, especially of indium and antimony, are effectively removed. It has been found that the cleaning effect of xenon may be up to ten times as efficient than with an argon process. In one embodiment, the implantation tool 100 may be operated during the xenon clean step with a dummy substrate (not shown) placed on the substrate holder 102. The dummy substrate may be comprised of any appropriate material that does not substantially lead to a further cross-contamination with a subsequent implant cycle. For instance, a bare silicon wafer may be used as a dummy substrate, since any silicon residues sputtered off the dummy wafer may not negatively affect a subsequent implant cycle due to its substantially inert behavior in other silicon-based product substrates.

In one illustrative embodiment, the substrate 104 may represent a product substrate that is to be treated so as to substantially amorphize a predefined portion of a crystalline semiconductor region. As previously noted, modem CMOS transistor structures may require a complex dopant profile including halo profiles within their well regions and in the drain/source regions, which typically include so-called extension regions having a shallow P-N junction formed with the surrounding channel region. It has been found that the constraints for the generation including the required anneal processes of these dopant profiles may somewhat be relaxed when the crystalline structure of the corresponding region is substantially amorphized prior to the formation of the halo and source/drain implants. Since the electronic characteristics of the amorphized region, except for the dopant atoms deliberately introduced into a portion of the amorphized region, should not be substantially altered after re-crystallization, typically inert ions are used for the amorphization implant. To obtain the desired destruction of the crystalline structure, heavy ions are preferably used at a high dosage. Thus, the xenon clean may advantageously be used as an amorphization implantation or at least as a part of the amorphization implant, since any cross-contamination particles may not very efficiently affect the characteristics of the amorphized region due to high dosage and the deep penetration depth of the implantation.

In other embodiments, the implantation tool 100 may be operated without any substrate. Irrespective whether the implantation tool 100 is operated with or without a substrate, the atmosphere within the process chamber 101 may be established such that a maximum cleaning effect is achieved. For instance, the pressure within the chamber 101 may be increased compared to regular operating conditions so as to obtain a higher degree of scattering of the xenon ions, thereby more effectively removing previously deposited dopants. To this end, the purge gas source 108 may be connected to the chamber 101 to provide a desired flow rate of purge gas, for example xenon or argon gas. Similarly, the pressure in the beam line 106, if not controlled by the pump 107, may also be newly adapted to a higher value during the cleaning step. The pressure in the chamber 101 and/or the beam line 109 may be adjusted to approximately 10–100 mTorr.

In other embodiments, the chamber 101 may be purged one or more times by connecting the purge gas source 108 to the chamber 101 while discontinuing the clean implantation process. In this way, the clean efficiency may be enhanced without unduly prolonging the overall process time of the clean process as a required vacuum pressure for resuming of the implant, either as clean process or as regular process, may be obtained within approximately 1 or 2 minutes with a typical vacuum pump.

It should be noted that although the present invention is especially advantageous when used as a clean or amorphization process when replacing a heavy dopant species by a light species intended to be implanted by relatively low energies, the present invention may also be applied for any clean process irrespective of the dopant species previously used in the implantation tool.

Thus, the present invention provides for an efficient clean sequence by using xenon instead of, for example, argon, wherein, due to enhanced cleaning capability, an overall reduction of process time is achieved by increasing implant tool utilization.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    operating an implantation tool to ionize a first species including a first dopant;
    after operating said implantation tool to ionize said first species, operating said implantation tool to ionize xenon as an implant precursor to reduce residues of said first species in said implantation tool; and
    after operating said implantation tool to ionize said xenon, operating said implantation tool to ionize a second species including a second dopant.

2. The method of claim 1, wherein said first dopant comprises at least one of arsenic, indium and antimony.

3. The method of claim 2, wherein said second dopant comprises one of boron and phosphorus.

4. The method of claim 1, wherein said ionized xenon is accelerated with an energy in the range of approximately 30–200 keV.

5. The method of claim 1, wherein said ionized xenon is accelerated with an energy in the range of approximately 40–160 keV.

6. The method of claim 1, wherein a dose of xenon is in the range of approximately $1 \times 10^{13}$ to $1 \times 10^{14}$ ions/cm$^2$ when operating said implantation tool to ionize said xenon.

7. The method of claim 1, wherein said implantation tool is operated to ionize xenon for a time interval in the range of approximately 2–10 minutes.

8. The method of claim 1, further comprising purging and evacuating said implantation tool at least once prior to operating said implantation tool to ionize said second species.

9. The method of claim 1, wherein operating said implantation tool to ionize said first species includes implanting said first dopant into a semiconductor region of a substrate to form one of a well profile and a halo profile for a transistor structure.

10. The method of claim 9, wherein operating said implantation tool to ionize said xenon includes implanting xenon ions into said semiconductor region to amorphize a portion thereof.

11. The method of claim 1, wherein operating said implantation tool to ionize said xenon is performed without a substrate placed in said implantation tool.

12. The method of claim 1, wherein operating said implantation tool to ionize said xenon is performed with a substrate that has not been exposed to said first species.

13. A method of doping a substrate, the method comprising:

operating an implantation tool to ionize xenon as the implantation species prior to installing said substrate in the implantation tool to reduce contaminating particles; and after operating said implantation tool to ionize said xenon, operating said implantation tool with the substrate mounted therein to ionize and implant a first species of dopants in the substrate.

14. The method of claim 13, further comprising operating said implantation tool to ionize a second species other than said first species prior to operating said implantation tool to ionize said xenon.

15. The method of claim 13, wherein said first species is one of arsenic, indium, antimony, boron and phosphorus.

16. The method of claim 14, wherein said second species is one of arsenic, indium, antimony, boron and phosphorus.

17. The method of claim 14, wherein said first species is one of boron and phosphorus.

18. The method of claim 14, wherein said second species is one of arsenic, indium and antimony.

19. The method of claim 13, wherein said ionized xenon is accelerated with an energy in the range of approximately 30–200 keV.

20. The method of claim 13, wherein said ionized xenon is accelerated with an energy in the range of approximately 40–160 keV.

21. The method of claim 13, wherein a dose of xenon is in the range of approximately $1 \times 10^{13}$ to $1 \times 10^{14}$ ions/cm$^2$ when operating said implantation tool to ionize said xenon.

22. The method of claim 13, wherein said implantation tool is operated to ionize said xenon for a time interval in the range of approximately 2–10 minutes.

23. A method of doping substrates, the method comprising:

mounting a substrate in an implantation tool;

operating said implantation tool to ionize a first species of dopants to implant said first dopant into a crystalline region of said substrate;

after operating said implantation tool to ionize said first species, operating said implantation tool to ionize xenon as the implantation species to substantially amorphize a portion of said crystalline region; and after operating said implantation tool to ionize said xenon, operating said implantation tool to ionize a second species of dopants to implant said second dopant into said substantially amorphized portion.

24. The method of claim 23, wherein said ionized xenon is implanted with an energy in the range of approximately 30–200 keV.

25. The method of claim 23, wherein said ionized xenon is implanted with an energy in the range of approximately 40–160 keV.

26. The method of claim 23, wherein a dose of xenon is in the range of approximately $1 \times 10^{13}$ to $1 \times 10^{14}$ ions/cm$^2$ when operating said implantation tool to ionize said xenon.

27. The method of claim 23, further comprising, prior to amorphizing said portion, operating said implantation tool to ionize said xenon when said substrate is removed from said implantation tool to reduce residues of said first species.

* * * * *